(12) United States Patent
Kelman et al.

(10) Patent No.: US 7,718,707 B2
(45) Date of Patent: May 18, 2010

(54) METHOD FOR PREPARING NANOPARTICLE THIN FILMS

(75) Inventors: Maxim Kelman, Mountain View, CA (US); Xuegeng Li, Sunnyvale, CA (US); Pingrong Yu, Sunnyvale, CA (US); Karel Vanheusden, Los Altos, CA (US); David Jurbergs, Austin, TX (US)

(73) Assignee: Innovalight, Inc., Santa Clara, CA (US)

( * ) Notice: Subject to any disclaimer, the term of this patent is extended or adjusted under 35 U.S.C. 154(b) by 0 days.

(21) Appl. No.: 11/842,466

(22) Filed: Aug. 21, 2007

(65) Prior Publication Data

US 2008/0152938 A1 Jun. 26, 2008

Related U.S. Application Data

(60) Provisional application No. 60/876,328, filed on Dec. 21, 2006, provisional application No. 60/901,768, filed on Feb. 16, 2007.

(51) Int. Cl.
*B05D 7/00* (2006.01)
*B22F 3/00* (2006.01)
*B01F 3/04* (2006.01)
*C09K 3/30* (2006.01)

(52) U.S. Cl. .................... 516/1; 427/212; 428/546
(58) Field of Classification Search .................. 516/1; 427/212; 428/546
See application file for complete search history.

(56) References Cited

U.S. PATENT DOCUMENTS

| | | | |
|---|---|---|---|
| 4,040,849 A | 8/1977 | Greskovich et al. | |
| 4,262,631 A | 4/1981 | Kubacki | |
| 4,330,358 A | 5/1982 | Grabmaier et al. | |
| 4,407,858 A | 10/1983 | Hanke et al. | |
| 4,876,218 A | 10/1989 | Pessa et al. | |
| 4,910,167 A | 3/1990 | Lee et al. | |
| 5,057,163 A | 10/1991 | Barnett et al. | |
| 5,141,893 A | 8/1992 | Ito et al. | |
| 5,262,357 A | 11/1993 | Alivisatos et al. | |
| 5,336,335 A | 8/1994 | Hall et al. | |
| 5,476,248 A | 12/1995 | Kobayashi et al. | |
| 5,556,791 A | 9/1996 | Stevens et al. | |
| 5,576,248 A | 11/1996 | Goldstein | |
| RE36,156 E | 3/1999 | Hall et al. | |
| 6,111,191 A | 8/2000 | Hall et al. | |
| 6,515,314 B1* | 2/2003 | Duggal et al. | 257/184 |
| 6,559,479 B1 | 5/2003 | Lüdemann | |
| 6,815,218 B1 | 11/2004 | Jacobson et al. | |
| 6,878,871 B2 | 4/2005 | Scher et al. | |
| 6,951,996 B2 | 10/2005 | Timans et al. | |
| 6,984,265 B1 | 1/2006 | Raguse et al. | |
| 6,991,972 B2 | 1/2006 | Lochtefeld et al. | |
| 7,375,011 B1 | 5/2008 | Kahen | |
| 2002/0192956 A1 | 12/2002 | Kizilyalli et al. | |
| 2003/0003300 A1 | 1/2003 | Korgel et al. | |
| 2003/0226498 A1 | 12/2003 | Alivisatos et al. | |
| 2004/0000476 A1* | 1/2004 | Cho et al. | 204/179 |
| 2005/0008880 A1 | 1/2005 | Klaus et al. | |
| 2005/0104125 A1 | 5/2005 | Sato et al. | |
| 2005/0126628 A1 | 6/2005 | Scher et al. | |
| 2005/0183767 A1 | 8/2005 | Yu et al. | |
| 2005/0205410 A1 | 9/2005 | Babko-Malyi et al. | |
| 2006/0042414 A1 | 3/2006 | Sankaran et al. | |
| 2006/0051505 A1* | 3/2006 | Kortshagen et al. | 427/212 |
| 2006/0154036 A1 | 7/2006 | Klaus et al. | |
| 2006/0237719 A1 | 10/2006 | Colfer et al. | |
| 2007/0218657 A1 | 9/2007 | Bet et al. | |
| 2007/0252500 A1 | 11/2007 | Ranish et al. | |
| 2008/0152938 A1 | 6/2008 | Kelman et al. | |
| 2008/0160265 A1 | 7/2008 | Hieslmair et al. | |
| 2008/0160733 A1 | 7/2008 | Hieslmair et al. | |
| 2009/0001517 A1 | 1/2009 | Swanson et al. | |
| 2009/0053878 A1 | 2/2009 | Kelman et al. | |

FOREIGN PATENT DOCUMENTS

| | | |
|---|---|---|
| EP | 1085075 | 3/2001 |
| EP | 1551057 A | 7/2005 |
| GB | 2346528 | 8/2000 |
| JP | 2005/332913 A2 | 12/2005 |
| WO | WO 99/26726 | 6/1999 |
| WO | WO 2004/023527 | 3/2004 |

(Continued)

OTHER PUBLICATIONS

Christiansen, T. et al., "Standard Operating Procedure: Spin-on-Glass Surface Level Characterization," Jun. 8, 2000.

(Continued)

*Primary Examiner*—Ling-Siu Choi
*Assistant Examiner*—Chun-Cheng Wang
(74) *Attorney, Agent, or Firm*—Foley & Lardner LLP

(57) ABSTRACT

A set of nanoparticles is disclosed. Each nanoparticle of the set of nanoparticles is comprised of a set of Group IV atoms arranged in a substantially spherical configuration. Each nanoparticle of the set of nanoparticles further having a sphericity of between about 1.0 and about 2.0; a diameter of between about 4 nm and about 100 nm; and a sintering temperature less than a melting temperature of the set of Group IV atoms.

19 Claims, 13 Drawing Sheets

FOREIGN PATENT DOCUMENTS

| WO | WO 2004/068536 A2 | 8/2004 |
|---|---|---|
| WO | 2006/096201 | 9/2006 |
| WO | WO 2006/096201 | 9/2006 |
| WO | WO 2008/039757 | 4/2008 |
| WO | WO 2008/073763 | 6/2008 |
| WO | WO 2008/076744 | 6/2008 |

OTHER PUBLICATIONS

Jang, W. I. et al., "Fabrication of MEMS Devices by Using Anhydrous HF Gas-phase Etching with Alcoholic Vapor" *J. Micromech. Microeng.*, vol. 12, 2002, pp. 297-306; published by IOP Publishing Ltd.

Kubacki, R. M., "Low Temperature Plasma Deposition of Silicon Nitride to Produce Ultra-Reliable, High Performance, Low Cost Sealed Chip-on-Board (SCOB) Assemblies" *IEEE Transactions on Components, Packaging, and Manufacturing Technology—Part A*, vol. 18, No. 3, Sep. 1995, pp. 471-477.

Lee, J. H. et al, "Gas-Phase Etching of Sacrificial Oxides Using Anhydrous HF and $CH_3OH$," $10^{th}$ Annual Internat'l Workshop on MEMS, IEEE, Jan. 26-30, 1997, pp. 448-453.

Orfert, M. et al., "Plasma Enhanced Chemical Vapor Deposition of SiN-films for Passivation of Three-Dimensional Substrates" *Surface and Coatings Technology 116-119*, 1999, pp. 622-628; published by Elsevier Science S.A.

Schmid, P. et al, "Plasma deposition of Si-N and Si-O passivation layers on three-dimensional sensor devices" *Surface and Coating Technology 98*, 1998, pp. 1510-1517; published by Elsevier Science S.A.

Ai et al., "Preparation and characterization of Si sheets by renewed SSP technique," *Journal of Crystal Growth*, vol. 270 (2004), pp. 446-454.

Q. Ban, et al., "Substrate Materials for Poly-CSiTF Solar Cells: Optimization of Silicon Sheet from Powder", *Acta Metallurgica Sinica*, vol. 18, No. 3 (Jun. 2005), pp. 184-188.

Q Ban et al., "Study on Preparation Technology of Polycrystalline Silicon Thin Film Solar Cells Based on SSP Substrate", *Acta Energiae Solaris Sinica*, vol. 25, No. 1 (Feb. 2004), pp. 95-98.

Bet et al., "Laser Forming of Silicon Films Using Nanoparticle Precursor" *Journal of Electronic Materials*, vol. 35, No. 5 (2006), pp. 993-1004.

Britton, D.T. and M. Härting, "Printed Nanoparticulate Composites for Silicon Thick Film Electronics," *Pure and Applied Chemistry*, vol. 78, No. 9 (2006), 1723-1739.

Ghosh et al., "Theory of the electrical and photovoltaic properties of polycrystalline silicon" *Journal of Applied Physics*, vol. 51, No. 1 (1980) pp. 446-454.

Grovenor, C R M, "Grain boundaries in semiconductors," *J. Phys. C: Solid State Phys.*, vol. 18 (1985), pp. 4079-4119.

Liang et al, "Characterisation of direct epitaxial silicon thin film solar cells on a low-cost substrate," *Solar Energy Materials & Solar Cells*, vol. 80 (2003), pp. 181-193.

Mataré, H.F., "Carrier transport at grain boundaries in semiconductors," *Journal of Applied Physics*, vol. 56, No. 10 (1984), pp. 2605-2631.

McCann et al, "A Review of Thin Film Crystalline Silicon for Solar Cell Applications. Part 1: Native Substrates," *Solar Energy Materials and Solar Cells*, vol. 68, No. 2 (May 2001), pp. 135-171.

Möller et al., "Sintering of Ultrafine Silicon Powder," *Journal of the American Ceramic Society*, vol. 68, No. 6 (1985), pp. 320-325.

Yang et al., "Effect of pressure on melting temperature of silicon," *Journal of Physics: Condensed Matter*, vol. 15 (2003), pp. 4961-4965.

"Crystalline Silicon Thin-Film Solar Cells," a Product Information Sheet published by Fraunhofer Institut Solare Energie Systeme, Oct. 2001, pp. 1-6.

D.V. Melnikov et al., "Quantum Confinement in Phosphorus-Doped Silicon Nanocrystals", *Physical Review Letters*, vol. 92 (2004), pp. 046802-1-046802-4.

Y.H. Tang et al., "Microstructure and Filed-Emission Characteristics of Boron-Doped SI Nanoparticle Chains", *Applied Physics Letters*, vol. 79 (2001), pp. 1673-1675.

I. Ifuku et al., "Fabrication of Nanocrystalline Silicon with Small Spread of Particle Size by Pulsed Gas Plasma", *Japanese Journal of Applied Physics*, vol. 36 (1997), pp. 4031-4034.

A.N. Goldstein, "The Melting of Silicon Nanocrystals: Submicron Thin-film Structures Derived from Nanocrystal Precursors", *Applied Physics A*, V. 62 (1996) pp. 33-37.

T. Shiga et al., "Photovoltaic performance and stability of CdTe/polymeric hybrid solar cells using a C60 buffer layer," *Solar Energy Materials and Solar Cells*, vol. 90, No. 12, (Jan. 2006), pp. 1849-1858; published by Elsevier Science Publishers, Amsterdam, NL.

International Search Report and Written Opinion for PCT/US2007/087205, mailed May 28, 2008.

International Search Report for PCT/IB2004/000221 (WO 2004/068536 A2), mailed Aug. 30, 2004.

International Search Report for PCT/US2007/077765, mailed Feb. 1, 2008.

International Search Report/Written Opinion for PCT/US2007/086376, mailed May 28, 2008.

International Search Report/Written Opinion for PCT/US2007/086432, mailed May 28, 2008.

International Search Report and Written Opinion for PCT/US2007/076549, mailed Jul. 25, 2008.

International Search Report for PCT/US2007/070134, mailed Aug. 11, 2008.

International Search Report for PCT/US2008/059038, mailed Jul. 18, 2008.

International Search Report and Written Opinion for PCT/US2008/062182 dated Nov. 4, 2008.

J. R. Heath et al., "Nanocrystal Seeding: A low temperature route to polycrystalline Si films," *Applied Phys. Lett.* vol. 64, No. 26, Jun. 27, 1994, pp. 3569-3571.

G. Samdani et al., "Tiny Particles Aim for Big Markets;" *Chemical Eng.*, Aug. 1994, pp. 35-39.

A. N. Goldstein et al, "Melting in Semiconductor Nanocrystals," *Science*, vol. 256, No. 5062, Jun. 5, 1992, pp. 1425-1427.

Ph. Buffat et al., "Side Effect on the Melting Temperature of Gold Particles," *Physical Review A*, vol. 13, No. 6, Jun. 1976.

F. Ercolessi et al., "Melting of Small Gold Particles: Mechanism and Size Effects," *Physical Review Letters*, vol. 66, No. 7, Feb. 18, 1991, pp. 911-914; published by The American Physical Society.

M. Wautelet, "Estimation of the variation of the melting temperature with the size of small particles, on the basis of a surface-phonon instability model,:" *J. Phys. D: Appl Phys*, vol. 24 (1991), pp. 343-346; published by IOP Publishing Ltd.

R. S. Berry et al., "Melting of Clusters and Melting," *Physical Review A*, vol. 30, No. 2, Aug. 1984; published by The American Physical Society.

Office Action in U.S. Appl. No. 11/875,261 dated Apr. 16, 2009.

Office Action issued in U.S. Appl. No. 11/875,261 mailed Oct. 14, 2009, received Oct. 19, 2009.

Office Action issued in U.S. Appl. No. 11/775,509 mailed Oct. 15, 2009, received Oct. 19, 2009.

* cited by examiner

METHOD FOR PREPARING NANOPARTICLE THIN FILMS

CROSS-REFERENCE TO RELATED APPLICATIONS

This application claims the benefit of U.S. Provisional Patent Application Ser. No. 60/876,328, filed Dec. 21, 2006; and U.S. Provisional Patent Application Ser. No. 60/901,768, filed Feb. 16, 2007; the entire disclosures of which are incorporated by reference.

FIELD OF DISCLOSURE

This disclosure relates in general to nanoparticles and in particular to Group IV nanoparticles and films comprising Group IV nanoparticles.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.). Group IV semiconductors generally refer to those elements in the fourth column of the periodic table (e.g., carbon, silicon, germanium, etc.).

In general, a solid semiconductor tends to exist in three forms: crystalline, polycrystalline, and amorphous. In crystalline form, semiconductor atoms are positioned in a single unbroken crystal lattice with no grain boundaries. In polycrystalline form, the semiconductor atoms are positioned in many smaller and randomly oriented crystallites (smaller crystals). The crystallites are often referred to as grains. In amorphous form, the semiconductor atoms show no long-range positional order.

In general, conduction generally refers to the movement of electrically charged carriers, such as electrons or holes (i.e., lack of electrons), through a transmission medium. Metals tend to have substantial amounts of electrically charged particles available, whereas insulators have very few.

In the absence of impurities (called dopants), a semiconductor tends to behave as insulator, inhibiting the flow of an electric current. However, after the addition of relatively small amounts of dopants, the electrical characteristics of a semiconductor can dramatically change to a conductor increasing the amount of electrically charged carriers.

Depending on the kind of impurity, a doped region of a semiconductor can have more electrons (n-type) or more holes (p-type). For example, in a common configuration, a p-type region is placed next to an n-type region in order to create a (p-n) junction with an electric field. Consequently, electrons on the p-type side of the junction within the electric field may then be attracted to the n-type region and repelled from the p-type region, whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc.

In another example, a junction may be created by placing an intrinsic (undoped) intrinsic semiconductor layer between the n-type region and the p-type region in order to mitigate the effects of quantum tunneling, a quantum-mechanical effect in which an electron transitions through a classically-forbidden energy state. For example, without an intrinsic separation layer, if the p-n junction is small enough, an electron can travel against the electric field and degrade the performance of the p-n junction.

In yet another example, a metal junction may be created by placing the n-type region and/or the p-type region next to a metal region in order to form an ohmic (low-impedance) contact.

One method of adding the impurities into the semiconductor involves depositing a doped glass on a semiconductor substrate, such as a Si wafer. Once exposed to relatively high temperature (e.g., 900-1000° C.), the dopants will tend to diffuse from the highly-doped glass into the substrate.

In addition, the high temperature also tends to anneal the substrate. Annealing is generally the process of heating a material above a critical or recrystallisation temperature in order to reduce the materials internal stresses, and or improve its physical and electrical properties. In the case of a semiconductor substrate, annealing allows the dopant atoms to properly position themselves in the lattice, such that the additional electrons or holes are available for the transmission of current. This is generally called activation and is critical for the creation of an efficient junction.

However, depositing doped glass may be problematic. For example, doped glass is often applied via a silk-screen. Silk-screening is generally a printing technique that makes use of a squeegee to mechanically force a liquid, such as a highly doped glass paste, directly onto a substrate. Consequently, this downward mechanical force tends to subject the substrate to additional stresses, and hence may detrimentally affect the electrical and physically characteristics of the substrate. In addition, creating alternating n-type and p-type regions on the same side of the substrate with a doped glass, such as with back contact solar cells, is difficult without the use of multiple and costly time-consuming printing steps.

Another method of adding the impurities into the semiconductor involves depositing dopants in a crystalline or polycrystalline substrate through ion implantation. Ion implantation generally accelerates dopant ions into the substrate at high energy. Like diffusion doping, the substrate must also generally be annealed at a high temperature to repair the substrate and activate the dopants. However, although dopant dosage may be controlled with high precision, ion implantation tends to be very expense since it requires the use of specialized and expensive semiconductor manufacturing equipment.

In yet a third technique of adding the impurities into the semiconductor, doped (thin) film layers may be formed using deposition techniques such as chemical vapor deposition (CVD). In a typical CVD process, a substrate (which can be an insulator, a semiconductor, or metal) is exposed to one or more volatile precursors, which react and/or decompose on the substrate surface to produce a doped film. However, like ion implantation, CVD is expensive since it requires specialized and expensive semiconductor manufacturing equipment. In addition, CVD also tends to be very slow, as the film layers are built up a single atom at a time.

In view of the foregoing, there is desired a method of producing low cost and efficient junctions for electrical devices, such as solar cells.

SUMMARY

The invention relates, in one embodiment, to a set of nanoparticles, wherein each nanoparticle of the set of nanoparticles is comprised of a set of Group IV atoms arranged in a substantially spherical configuration. Each nanoparticle of the set of nanoparticles further having a sphericity of between about 1.0 and about 2.0; a diameter of between about 4 nm and about 100 nm; and a sintering temperature less than a melting temperature of the set of bonded Group IV atoms.

The invention relates, in another embodiment, to a set of doped Group IV nanoparticles made by a process comprising introducing a Group IV precursor gas and a dopant gas into a plasma reactor. The process further includes striking a radiofrequency plasma in the plasma reactor, and forming a set of substantially spherical doped nanoparticles, wherein each nanoparticle of the set of substantially spherical doped nanoparticles has a diameter of between about 4 nm and about 100 nm.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
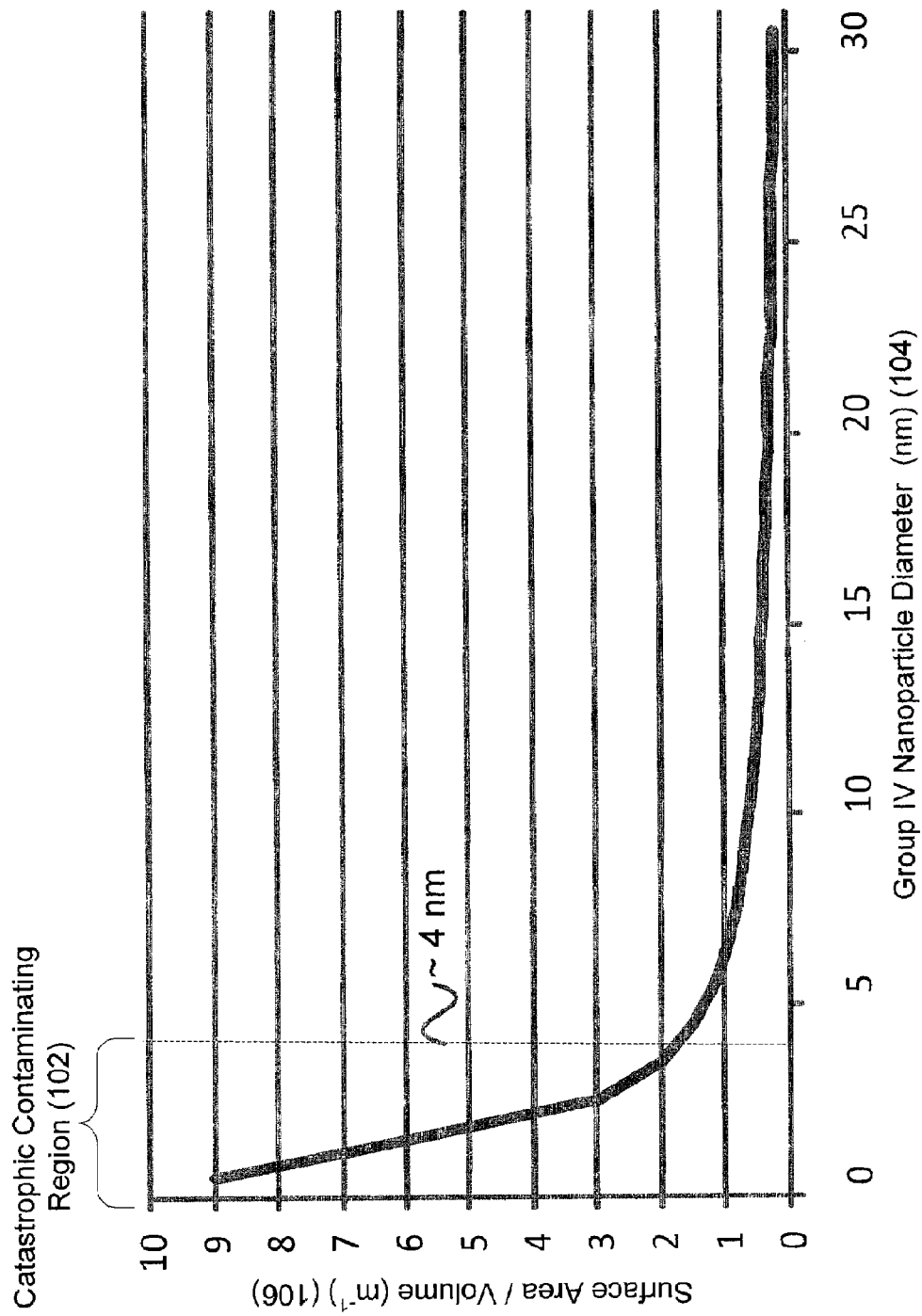
FIG. 1. shows a simplified diagram comparing surface area/volume to diameter for a set of Si nanoparticles, in accordance with the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In an advantageous manner, a set of Group IV nanoparticles may be created such that an efficient junction (e.g., p-n, metal-silicon, etc.) may be formed at a substantially lower cost than alternate methods. In one configuration, the formed junction includes at least one film. In another configuration, the Group IV nanoparticles are substantially spherical and preferably between about 4 nm and about 100 nm in diameter. In yet another configuration, the Group IV nanoparticles are substantially spherical and more preferably between about 4.0 nm and about 20.0 nm in diameter. In yet another configuration, the Group IV nanoparticles are substantially spherical and most preferably 7.0 nm.

In general, a nanoparticle is a microscopic particle with at least one dimension less than 100 nm. The term "Group IV nanoparticle" generally refers to hydrogen terminated Group IV nanoparticles having an average diameter between about 1 nm to 100 nm, and composed of silicon, germanium, carbon, or combinations thereof. The term "Group IV nanoparticle" also includes Group IV nanoparticles that are doped.

In comparison to a bulk material (>100 nm) which tends to have constant physical properties regardless of its size (e.g., melting temperature, boiling temperature, density, conductivity, etc.), nanoparticles may have physical properties that are size dependent, and hence useful for applications such as junctions. For example, semiconductor nanoparticles may be more easily and cheaply patterned p-n junctions when compared to alternate methods, such as silk-screening or deposition.

However, because they have substantially larger surface areas in comparison to bulk solids, Group IV nanoparticles also tend to be very susceptible to contamination. In general, since it is extremely difficult to completely prevent ambient oxygen or water molecules from coming into contact with the Group IV nanoparticles, contamination often occurs from such chemical reactions such as oxidation and/or hydrolysis. Consequently, even small amounts of contamination may inhibit sintering (i.e., interfering with the physical connection of the Group IV nanoparticles), delay dense layer formation (i.e., increasing material porosity and thus decreasing conductivity), and provide electron-hole recombination sites (i.e., attenuating current generation in the assembled junction).

In an advantageous manner, the Group IV nanoparticles may be formed into a substantially spherical shape in order to minimize contamination. In general, of all the solids having a given volume, a sphere is the one with the smallest surface area. Likewise, of all solids having a given surface area, the sphere is the one having the greatest volume. Consequently, a spherical nanoparticle will tend to shield the greatest number of Group IV atoms from contamination, and hence is beneficial to junction creation.

In general, semiconductor nanoparticles typically must be formed into dense connected regions in order to create a junction. One such method is sintering. Generally a method for making particles adhere to each other, interacting nanocrystals sinter before size-dependent melting occurs. A. N. Goldstein, *The melting of silicon nanocrystals: Submicron thin-film structures derived from nanocrystal precursors*, APPLIED PHYSICS, 1996. Consequently, Group IV nanoparticles that are substantially spherical and preferably between about 4 nm and about 100 nm in diameter tend to sinter at lower temperatures, and hence are beneficial to create junctions.

Referring now to FIG. 1. a simplified diagram is shown comparing surface area/volume to diameter for a set of Si nanoparticles, in accordance with the present invention. Horizontal axis 104 shows Si nanoparticle diameter in nanometers, whereas vertical axis 106 shows Si surface area/volume in meters$^{-1}$.

In general, Si atoms have an atomic radius of about 0.118 nm and tend to form a diamond crystal structure with a cell dimension of about 0.5431 nm. In addition, although not shown, Ge with an atomic radius of about 0.125 nm and a cell dimension of about 0.566 nm, will have a area/volume to diameter curve that is substantially similar to that of Si.

Below about 4 nm, in the catastrophic contaminating region 102, the surface area/volume ratio starts to substantially increase, from about 1.5 m$^{-1}$ (at about 4 nm) to about 6.0 m$^{-1}$ (at 1 nm). Eventually, all of the Si atoms are essentially surface or shell atoms, and the likelihood of contamination is extremely high. Thus, for purposes of contamination reduction, Group IV nanoparticles should be greater than about 4 mm in diameter.

Figure 2:
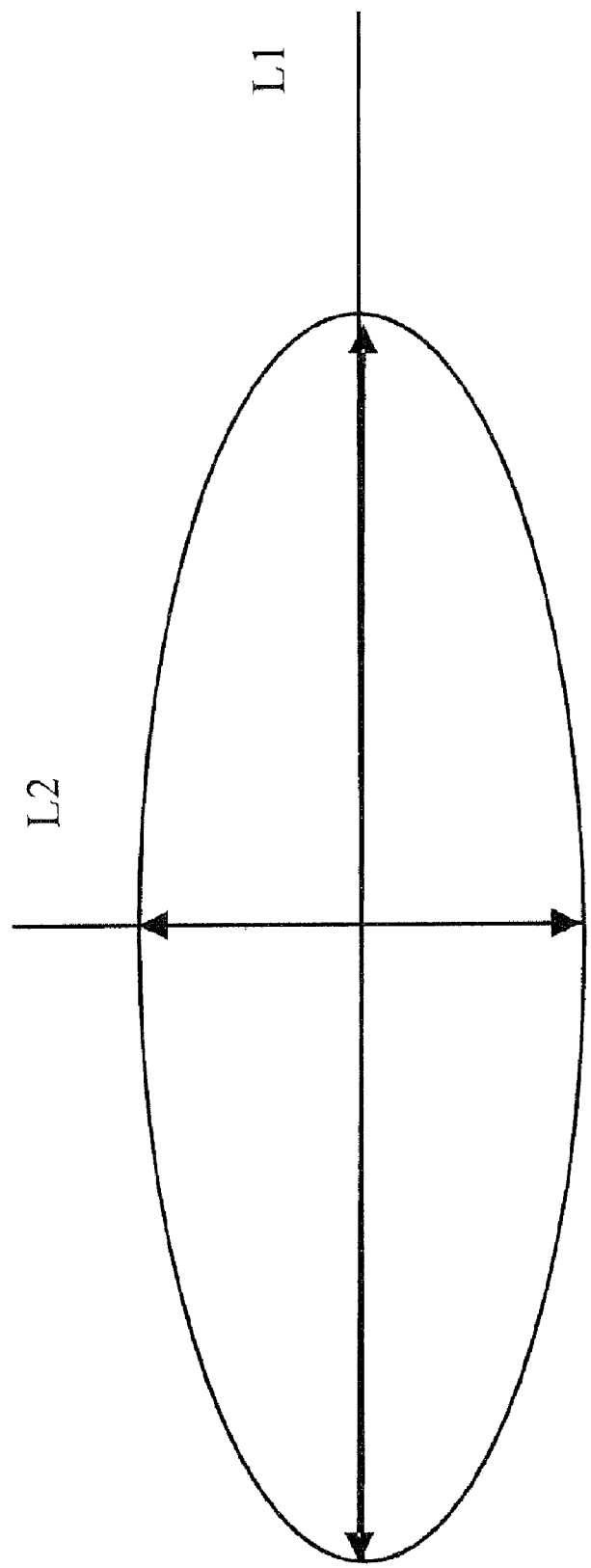
FIG. 2 shows a simplified diagram of sphericity for a Group IV nanoparticle, in accordance with the present invention.

Referring now to FIG. 2, a simplified diagram showing sphericity for a Group IV nanoparticle is shown, in accordance with the present invention. In general, a metric for particle shape uniformity or sphericity may be obtained by using transmission electron microscopy images. A transmission electron microscopy (TEM) is an imaging technique whereby a beam of electrons is transmitted through a specimen, then an image is formed, magnified and directed to appear either on a fluorescent screen or layer of photographic film (see electron microscope), or to be detected by a sensor such as a CCD camera.

Particle sizes may be measured by identifying individual particles and drawing a straight line cross a particles shortest and longest dimensions as shown in the graphical example. Uniformity may be defined as the ratio of the maximum diameter over the minimum diameter of a particle. By measuring the particle dimension defined as the ratio of the longest L1 over the shortest dimension L2, one can obtain the metric L1/L2 as the level of sphericity. For example, for an ideal spherical particle, uniformity is equal to about 1.0. For an irregular particle, uniformity is generally substantially larger than about 1.0. For example, if a particle is rod or needle shaped, the L1/L2 ratio may be greater than 5. Optimal sphericity is generally between about 1.0 and about 2.0. Aside from surface contamination, a L1/L2 ratio of below 2 is beneficial to nanoparticle application techniques, such as ink-jet printing.

Figure 3:
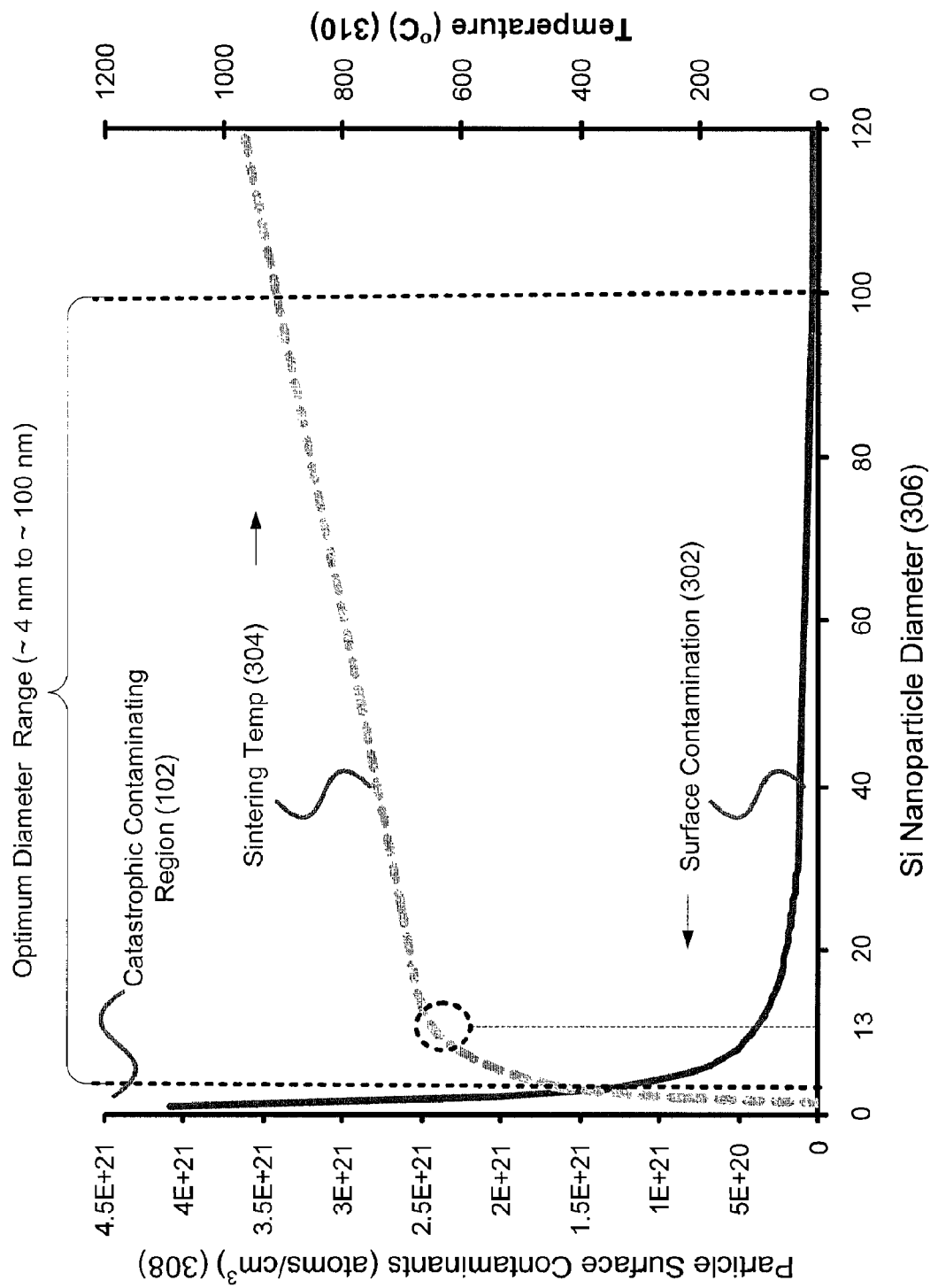
FIG. 3 shows a simplified comparison of surface contamination and melting temperature to diameter for Si nanoparticles, in accordance with the present invention.

Referring now to FIG. 3, surface contamination and melting temperature are compared to diameter for Si nanoparticles, in accordance with the present invention. Horizontal axis 306 shows Si nanoparticle diameter. Left-side vertical axis 308 shows particle surface contaminants whereas right-side vertical axis 310 shows temperature in degrees Celsius (° C.).

At about a 4 nm diameter, Si particle surface contamination is about $1.02 \times 10^{21}$ atoms/cm$^3$, corresponding to a surface area/volume ratio of about 1.5 m$^{-1}$ as previously shown. As the Si particle surface contamination increases above about $1.02 \times 10^{21}$ atoms/cm$^3$ in the catastrophic contaminating region (102), sintering, dense layer formation, and electron-hole recombination are aggravated, as previous stated.

In contrast, below about 13 nm, the sintering temperature of a Si nanoparticle sharply decreases with corresponding decrease in diameter size. Above about 13 nm, it is believed that the sintering temperature gradually increases with a corresponding increase in diameter size, eventually reaching about 947° C., or 67% of the melting temperature of Si (about 1414° C.). Likewise, although not shown in the figure, for germanium, it is believed that the sintering temperature also gradually increases with a corresponding increase in diameter size, eventually reaching about 628° C., or 67% of the melting temperature of Si (about 938° C.).

As previously described, sintering is generally a method for making particles adhere to each other and inducing densification of films. Consequently, because their small radii of curvature, it is believed that nanoparticles generally begin to sinter when a temperature of about ⅔ of the particle melting point is reached. It is further believed that large shear stresses generated by elevated temperatures in neck regions of the nanoparticles tend to cause a plastic deformation between two proximately located nanoparticles. For a given nanoparticles material, smaller nanoparticles generally have a lower sintering temperature than that of larger nanoparticles.

In general, various heat sources may be used to sinter the nanoparticle, such as conventional contact thermal sources (e.g., resistive heaters, etc.), as well as radiative heat sources (e.g., lamps, lasers, microwave processing equipment, plasmas, tungsten-halogen, continuous arc lamps, flash lamps, etc.). In the case of lasers, a wavelength range of between about 0.3 microns and about 10 microns is generally optimal.

In advantageous manner, lowering the sintering temperature reduces thermally induced stress in the underlying substrate that may subsequently damage the wafer and reduce minority carrier lifetime in photo-voltaic applications.

Additionally, a lower sintering temperature also allows the use of alternative materials in or near the junction (i.e., substrate, dielectric layer, etc.) that may have a melting point substantially below the Group IV melting temperature. For example, polyimides (e.g., Kapton, Kaptrex, etc.), with a glass temperature of around 4QO° C., may be used both as a dielectric and as a mask for production of electrical junctions. Consequently, by reducing the Group IV nanoparticle diameter sufficiently (to about 7 nm in this example), a dense nanoparticle layer may be formed on a polyimide layer.

Furthermore, smaller particles may be more readily suspended in a colloidal dispersion. Because of their small size, nanoparticles tend to be difficult to manipulate. Consequently, in an advantageous manner, assembled nanoparticles may be suspended in a colloidal dispersion or colloid, such as an ink, in order to transport and store the nanoparticles.

Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles.

In general, the Group IV nanoparticles are transferred into the colloidal dispersion under a vacuum, or else an inert substantially oxygen-free environment. In addition, the use of particle dispersal methods and equipment such as sonication, high shear mixers, and high pressure/high shear homogenizers may be used to facilitate dispersion of the nanoparticles in a selected solvent or mixture of solvents.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the Group IV nanoparticles in the colloidal dispersion, nanoparticle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

For example, bulky capping agents suitable for use in the preparation of capped Group IV semiconductor nanoparticles include C4-C8 branched alcohols, cyclic alcohols, aldehydes, and ketones, such as tertiary-butanol, isobutanol, cyclohexanol, methyl-cyclohexanol, butanal, isobutanal, cyclohexanone, and oraganosiloxanes, such as methoxy(tris(trimethylsilyl)silane)(MTTMSS), tris(trimethylsilyl)silane (TTMSS), decamethyltetrasiloxane (DMTS), and trimethylmethoxysilane (TMOS).

Once formulated, the colloidal dispersion may be applied to a substrate and subjected to a heat treatment in order to sinter the Group IV nanoparticles into a densified conductive film. Examples of application methods include, but are not limited to, roll coating, slot die coating, gravure printing, flexographic drum printing, and ink jet printing methods, etc.

In one particular configuration, in an advantageous manner, the colloidal dispersion may be applied in patterned regions by an inkjet printer. Inkjet printers generally are configured with a piezoelectric material in an ink-filled chamber behind each nozzle. When a voltage is applied, the crystal changes shape or size, which generates a pressure pulse in the fluid forcing a droplet of ink from the nozzle.

In the case of Group IV nanoparticles, the colloidal dispersions should disperse well in the selected solvents and should easily filter though a 500 nm filter (more preferably through a 300 nm filter), in order to optimize printability.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific layer of a junction is formulated by blending doped and undoped Group IV nanoparticles to achieve the requirements for that layer. Alternatively, the blended Group IV nanoparticle colloidal dispersions may be used to compensate for substrate defects, such as the passivation of oxygen atoms in order to reduce undesirable energy states.

Figure 4A:
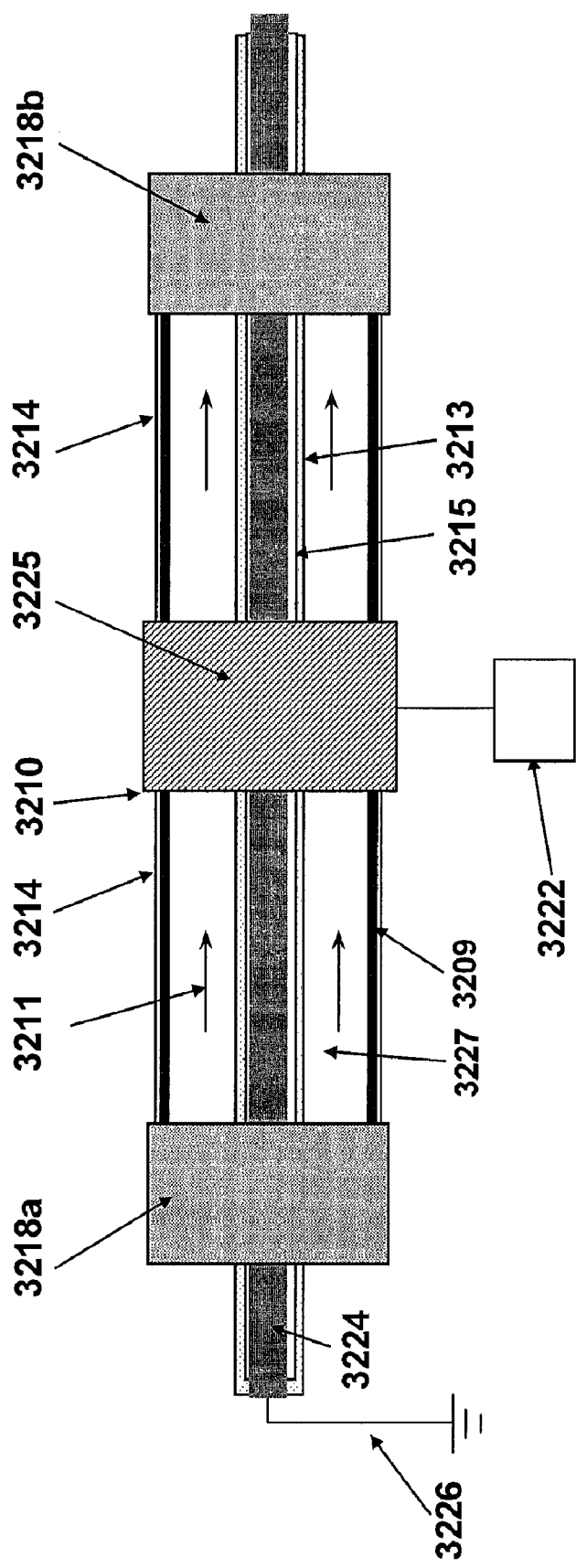
FIGS. 4A-C show a set of schematic diagrams for a concentric flow-through plasma reactor, in accordance with the present invention.
Figure 4B:
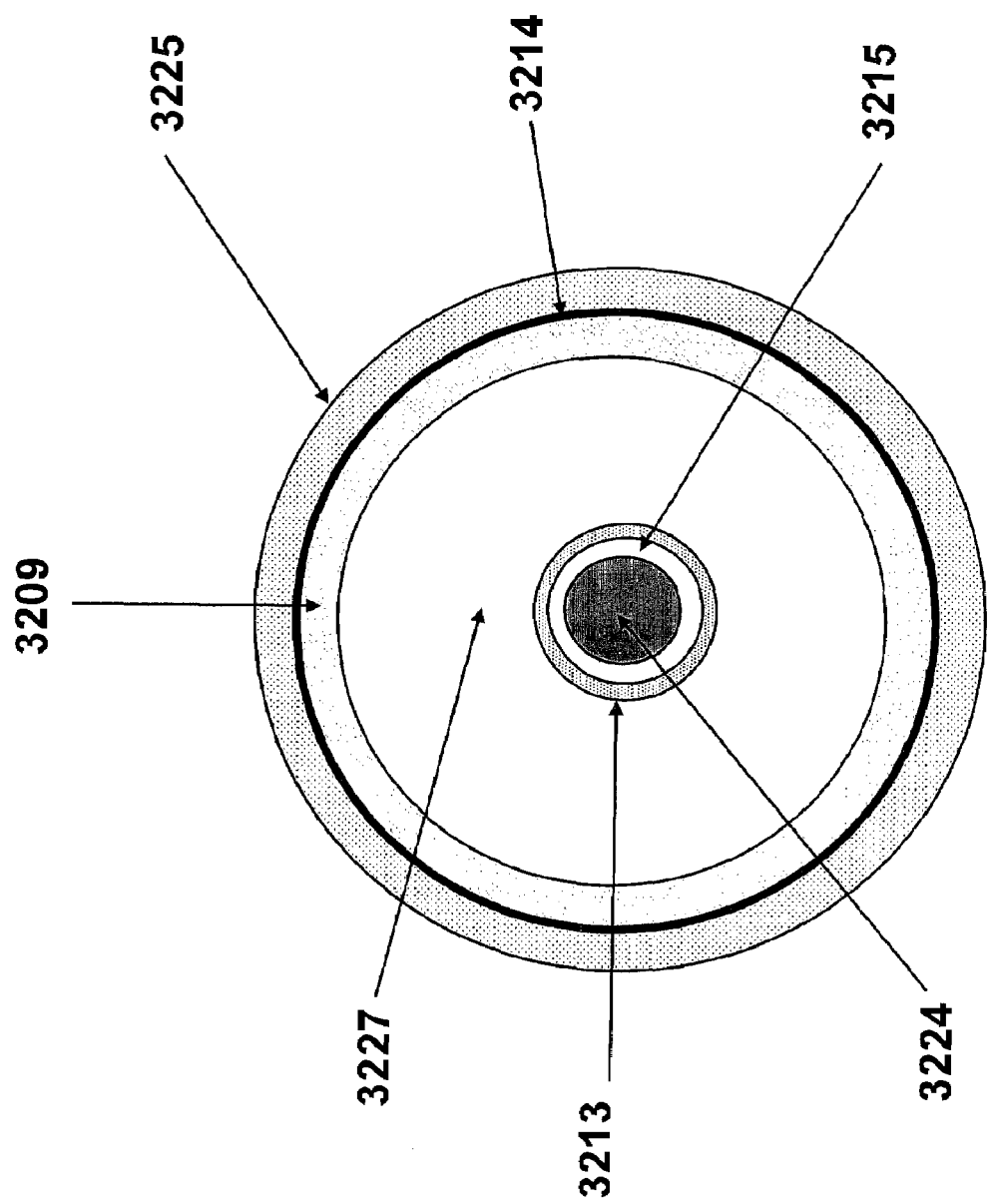
Figure 4C:
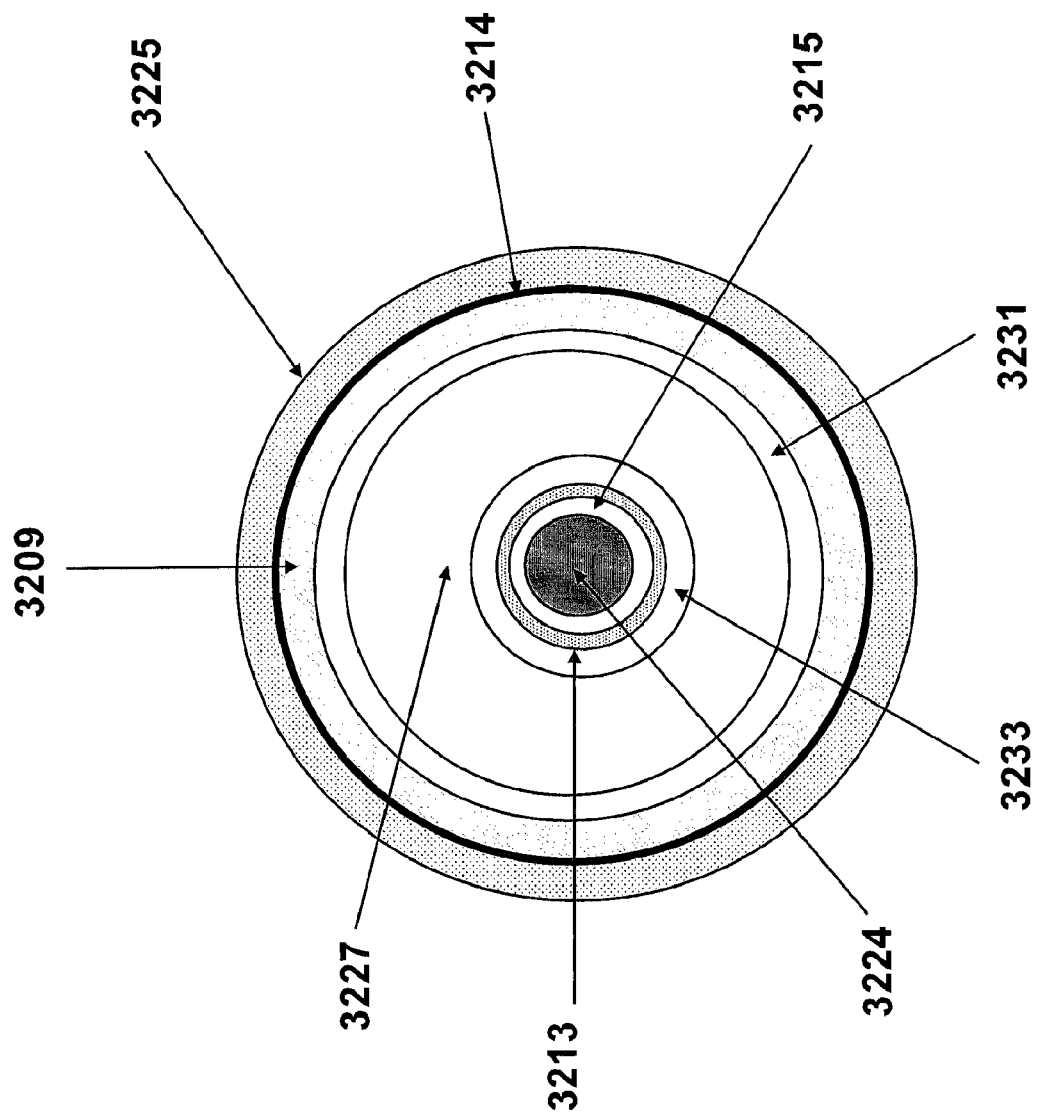

Referring now to FIGS. 4A-C, a set of schematic diagrams of a concentric flow-through plasma reactor is shown, in accordance with the present invention. FIG. 4A shows a side view. FIG. 4B shows a cross-sectional view. FIG. 4C shows the cross-sectional view of FIG. 4B with the addition of a coating on a first dielectric and a second dielectric.

In general, a Group IV precursor gas, a set of inert gases, as well as a dopant gas (if required), are generally flowed through the annular channel and ignited in a reaction zone between a set of electrodes. An RF (radiofrequency) signal is then applied to the powered electrode in order to strike a plasma and subsequently dissociate and form Group IV nanoparticles which are generally collected downstream of the reaction zone.

In general, the concentric flow-through plasma reactor is configured with an outer tube 3214 and an inner tube 3215 concentrically positioned along a longitudinal axis with respect outer tube 3214. An annular channel 3227, defined by the area inside outer tube 3214 and outside inner tube 3215, may be sealed from the ambient atmosphere by inlet port flange 3218a and outlet port flange 3218b.

A plasma reaction zone (i.e., the zone in which the nanoparticles are created) is defined as an area inside annular channel 3227 between a tube-shaped outer electrode 3225 (positioned outside outer tube 3214) and a tube-shaped central electrode 3224 (central electrode tube), positioned concentrically along a longitudinal axis with respect to tube-shaped outer electrode 3225 (outer electrode tube), and further positioned inside inner tube 3215. Typically, the precursor gas or gases may be introduced into annular channel 3227 along flow path 3211 from a precursor gas source in fluid communication with an inlet port (not shown) on inlet port flange 3218a. Similarly, nanoparticles produced within the plasma reactor chamber may exit through an exit port (not shown) on outlet port flange 3218b into a nanoparticle collection chamber (not shown). Alternatively, the nanoparticles may be collected on a substrate or grid housed in the plasma reactor chamber.

In general, tube-shaped central electrode 3224 is configured to extend along a substantial portion of the plasma reactor. In additional, tube-shaped central electrode 3224 and tube-shaped outer electrode 3225 may be made of any sufficiently electrically conductive materials, including metals, such as copper or stainless steel.

Outer tube 3214 may be further shielded from the plasma by outer tube dielectric layer 3209 disposed on the inner surface of outer tube 3214. In general, outer tube 3214 may be any material that does not substantially interfere with the generated plasma, such as a dielectric material. In an embodiment, outer tube 3214 and outer tube dielectric layer 3209 are comprised of different materials, such as different dielectric materials. In an alternate embodiment, outer tube 3214 and outer tube dielectric layer 3209 are the same physical structure and material, such as quartz. Likewise, inner tube 3215 may be further shielded from the plasma by inner tube dielectric layer 3213. Examples of dielectric materials include, but are not limited to, quartz, sapphire, fumed silica, polycarbonate alumina, silicon nitride, silicon carbide, and borosilicate.

In general, plasma reactor conditions during nanoparticle synthesis have a significant impact on the properties and structure of produced nanoparticles. During the nucleation and growth stages of particles synthesis, each individual particle will have a temperature that will depend on the applied plasma power, reactor pressure, and gas composition and reactor geometry.

Typically, Group IV nanoparticles produced below a certain temperature will be amorphous, whereas particles produced such that they are hotter during synthesis are crystalline. In addition to crystallinity, particle temperature during synthesis will affect dopant activation. Doped nanoparticles that were exposed to higher temperature during synthesis will have dopants that are electrically active, as opposed to the electrically inactive dopants in the low-temperature produced particles. By controlling the plasma synthesis parameters of doped Group IV particles it is possible to modify their electrical and structural properties.

A variety of dopant gases are possible for use for creating doped Group IV nanoparticles. Examples of Group IV precursor gases include silane, disilane, germane, digermane, halide analogs, etc. Examples of n-type dopant gases include phosphine, arsine, etc. Examples of p-type dopant gases include boron diflouride, trimethyl borane, diborane, etc. Examples of the inert gases include argon, helium, neon, etc.

In one configuration, Group IV nanoparticles may be produced in an RF plasma at a total pressure of no greater than about 25 Torr (e.g., about 3 Torr to about 25 Torr). Typical flow rates for the semiconductor precursor gas may be about 2 standard cubic centimeters (sccm) to about 30 seem, while the flow rate for a dopant gas may be about 60 sccm to about 150 seem (e.g., about 0.1% of dopant in inert buffer gas such as Ar). Typically, the ratio of semiconductor precursor gas molecules to dopant gas molecules in the plasma reaction is from about 25:1 to about 1000:1.

The frequency of the RF power source used to ignite and/or sustain the RF plasma may vary within the RF range from 300 kHz to 300 GHz. Typically, however, a frequency of 13.56 MHz will be employed because this is the major frequency used in the radiofrequency plasma processing industry. Typical radiofrequency powers range from about 30 W to about 300 W.

The concentration of dopants in the Group IV nanoparticles may vary depending on factors such as dopant gas concentration and flow rate. For example, silane or germane may be used as the Group IV precursor gas and phosphine may be used as the dopant gas in the present methods to produce phosphorous-doped silicon nanoparticles. However, the present radiofrequency plasma-based methods are capable of producing Group IV nanoparticles having dopant concentrations approaching the solubility limit of the dopant in a crystalline semiconductor.

For example, in the case of crystalline Si nanoparticles, the present methods can provide p-type (e.g., phosphorous or arsenic) doping levels of at least about 2%. This includes embodiments wherein the p-type dopant level in the silicon nanoparticles is between about 0.01% and about 5%.

Similarly, the present methods can provide n-type silicon nanoparticles with doping levels of at least about 1%. This includes embodiments wherein the n-type dopant level is between about 0.01% and about 5%.

In one configuration, doped Group IV nanoparticles may be formed as crystalline nanoparticles with activated dopants. This configuration is advantageous because it may eliminate the need for a high-temperature dopant activation step, thereby rendering the method less expensive, less time-consuming and more efficient.

Example 1

A set of p-type and intrinsic nanoparticles were prepared in an RF reactor substantially similar to that described for FIGS. 4A-C. For the p-type nanoparticles, a 10% silane gas in argon was used at a flow rate of 22.5 sccm. A dopant gas of diborane was used at a concentration of 100 ppm at flow rate of 75 sccm, providing a ratio of boron to silicon in the reactor of about 0.66%. The pressure in the RF plasma reactor chamber was maintained at about 10 Torr.

For the intrinsic nanoparticles, a 10% silane gas in argon was used at a flow rate of 22.5 sccm. As before, the pressure in the RF plasma reactor chamber was maintained at about 10 Torr.

The resulting nanoparticle size distribution for the p-type silicon nanoparticles was 5.2 nm+/−1.0 nm, while the size distribution for the intrinsic silicon nanoparticles was 5.7 nm+/−1.2 nm.

Careful inspection of transmission electron microscope (TEM) images of the p-type nanoparticles versus the intrinsic nanoparticles show the p-type nanoparticles tending to be of more irregular shape than the undoped particles. It is believed that is irregular shape reflects the in-situ incorporation of boron dopant atoms into the nanoparticle.

Example 2

Colloidal dispersions, made form the p-type and intrinsic nanoparticles of Example 1, were each deposited on a 1"×1"×0.04" quartz substrates. Prior to deposition, the quartz substrate was cleaned using an argon plasma.

Both colloidal dispersions were formulated as a 20 mg/ml solution in chloroform/chlorobenzene (4:1 v/v), which was sonicated using a sonication horn at 35% power for 15 minutes. A sufficient volume of each colloidal dispersion was delivered to each substrate respectively in order to effectively cover the quartz substrate surface. Porous compacts of between about 650 nm to about 700 nm thick were then formed by spin casting the colloidal dispersions on each substrate at 1000 rpm for 60 seconds.

The substrates were then subjected to a conditioning step at 100° C. for 15 minutes at a pressure of between about $5\times10^{-6}$ to about $7\times10^{-6}$ Torr using a 15 minute ramp. This was followed by a heat treatment at a temperature of 765° C., and a pressure of between about $5\times10^{-6}$ Torr to about $7\times10^{-6}$ Torr for 6 minutes, after a 15-minute ramp to the targeted fabrication temperature. Consequently, densified films formed were between about 300 nm to about 350 nm thick.

Figure 5A:
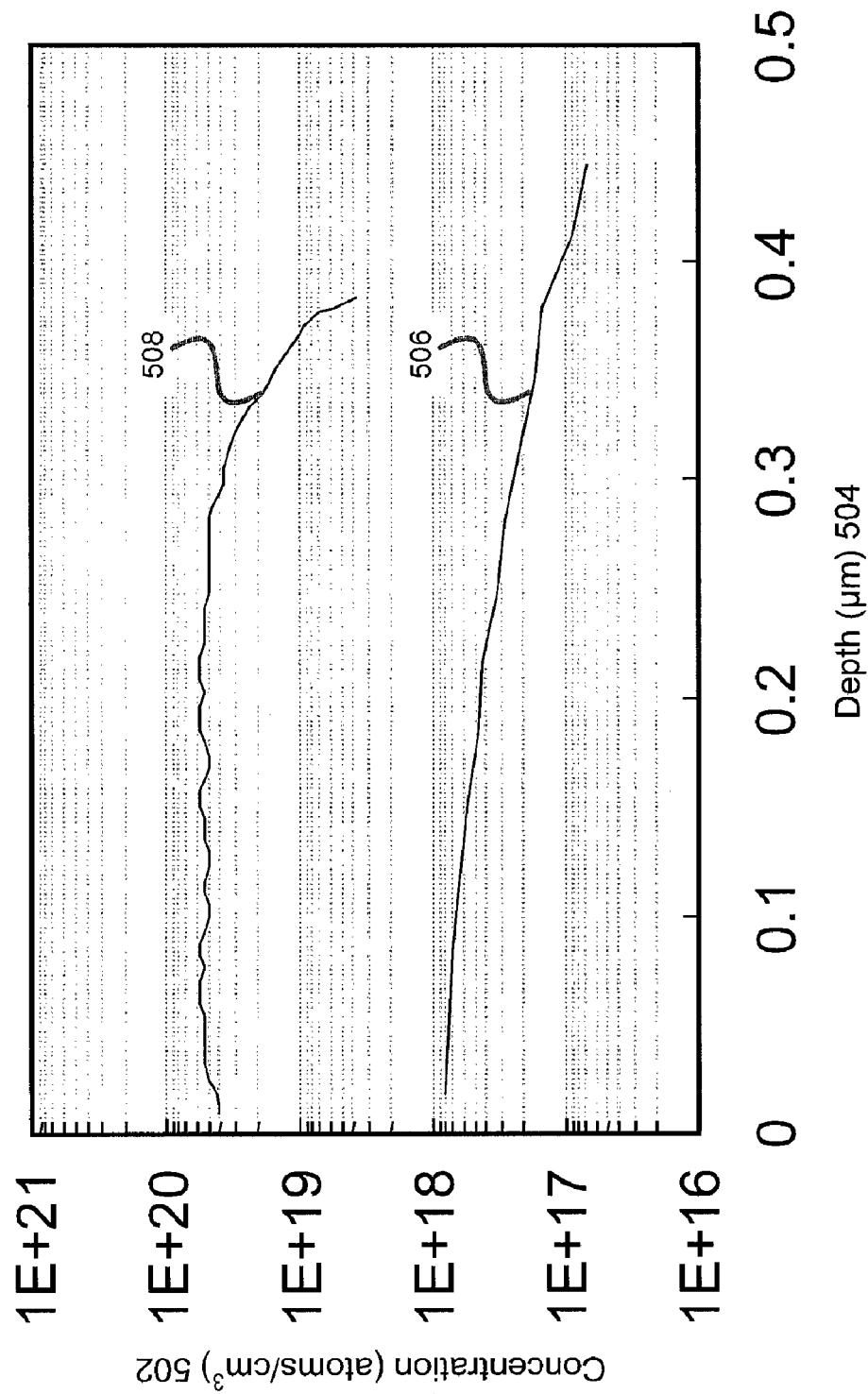
FIG. 5A shows a set of secondary ion mass spectroscopy (SIMS) results for an intrinsic (undoped) film and a p-type film, in accordance with the present invention.

Referring now to FIG. 5A, a set of secondary ion mass spectroscopy (SIMS) results for an intrinsic densified film 506 and a p-type densified film 508. Horizontal axis 504 shows depth in micrometers (μm), while vertical axis 502 shows concentration in atoms/cm$^3$.

For a depth of up to about 0.3 μm, level of boron in the p-type nanoparticle densified film is about $5\times10^{19}$ atoms/cc, while the level of boron in the intrinsic nanoparticle densified film is about $5\times10^{17}$ atoms/cc. In general, the substantial difference in order of magnitude (about 2×) between levels for the p-type densified film versus the instrinsic densified film demonstrates that the boron atoms were generally incorporated into the p-type nanoparticles. That is, the boron atoms were substantially retained during the thermal processing of the p-type nanoparticles.

Figure 5B:
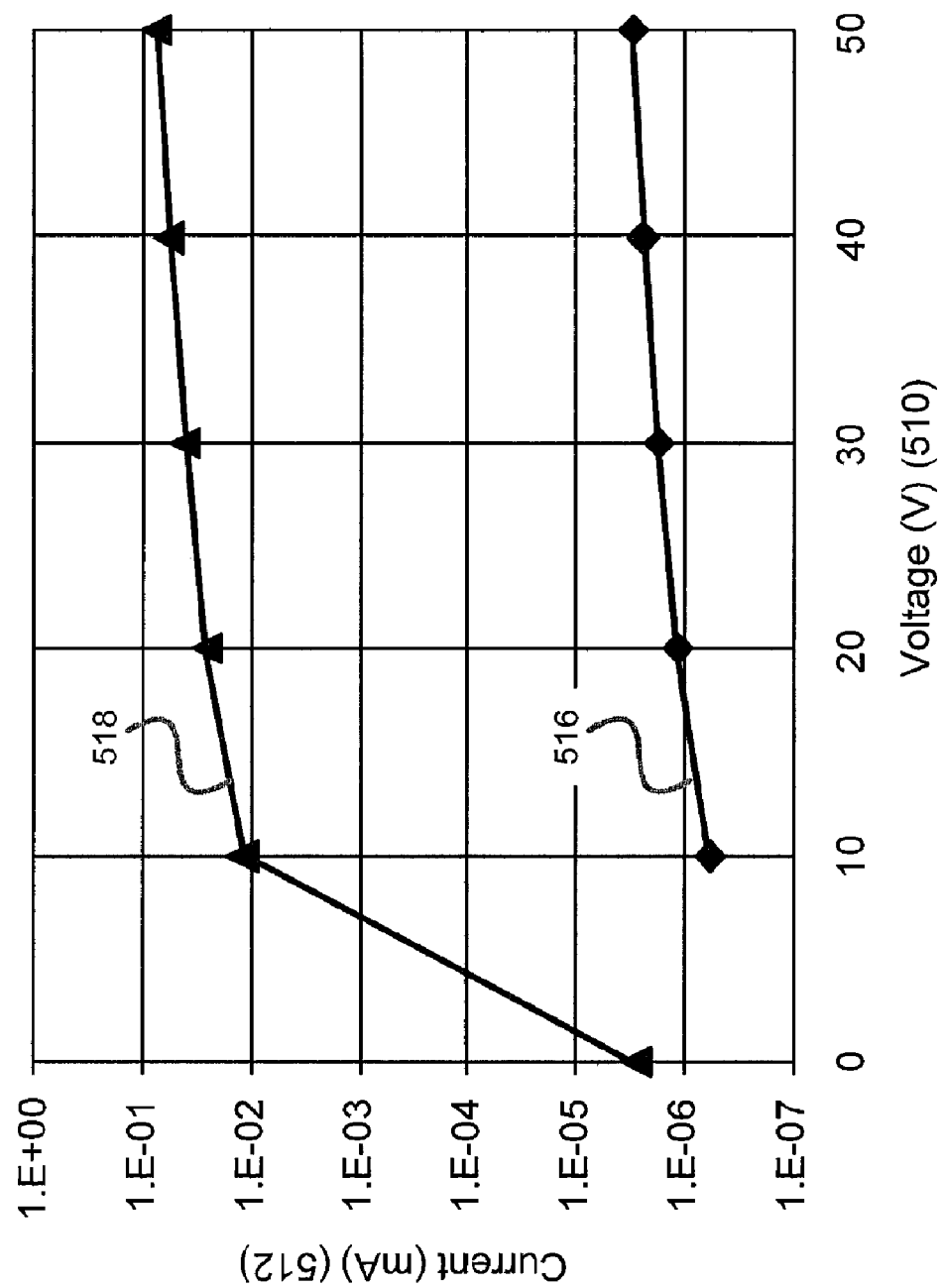
FIG. 5B shows a set of dark current versus voltage curves, in accordance with the present invention.

Referring now to FIG. 5B, a set of dark current versus voltage curves are shown, in accordance with the invention. Horizontal axis 510 shows voltage (V), while vertical axis 512 shows current (mA). In comparison to intrinsic nanoparticle film 516, p-type nanoparticle film 518 was able to conduct substantially more of dark current as voltage 510 was increased. Consequently, a conducting p-type Group IV nanoparticle film can be successfully fabricated from a p-type Group IV nanoparticle colloidal dispersion.

Example 3

A set of n-type nanoparticle colloidal dispersions were used in the fabrication of n-type nanoparticle films. In general, the steps for the preparation of each 1"×1"×0.04" quartz substrate through the preparation of the film were the same as for the preparation of the intrinsic nanoparticle film and p-type film of Example 2, above.

After depositing the intrinsic nanoparticle film on a first quartz substrate and the n-type nanoparticle on a second quartz substrate, each between about 500 nm to about 550 nm in thickness, both quartz substrates were baked in a conditioning step at 100° C. for 30 minutes in an inert atmosphere.

This was followed by a heat treatment in a rapid thermal processing (RTP) apparatus under argon atmosphere using a process profile described as follows:

1) Ramp to 800° C. in 30 seconds, hold for 30 seconds.

2) Ramp to 1100° C. in 5 seconds, followed by ramp back to 800° C. in 5 seconds, and hold for 30 seconds at 800° C.

3) Repeat step 2 for four additional cycles.

4) Ramp to ambient in 30 seconds.

Consequently, a set of densified films formed were between about 215 nm to about 250 nm thick.

Example 4

Figure 6:
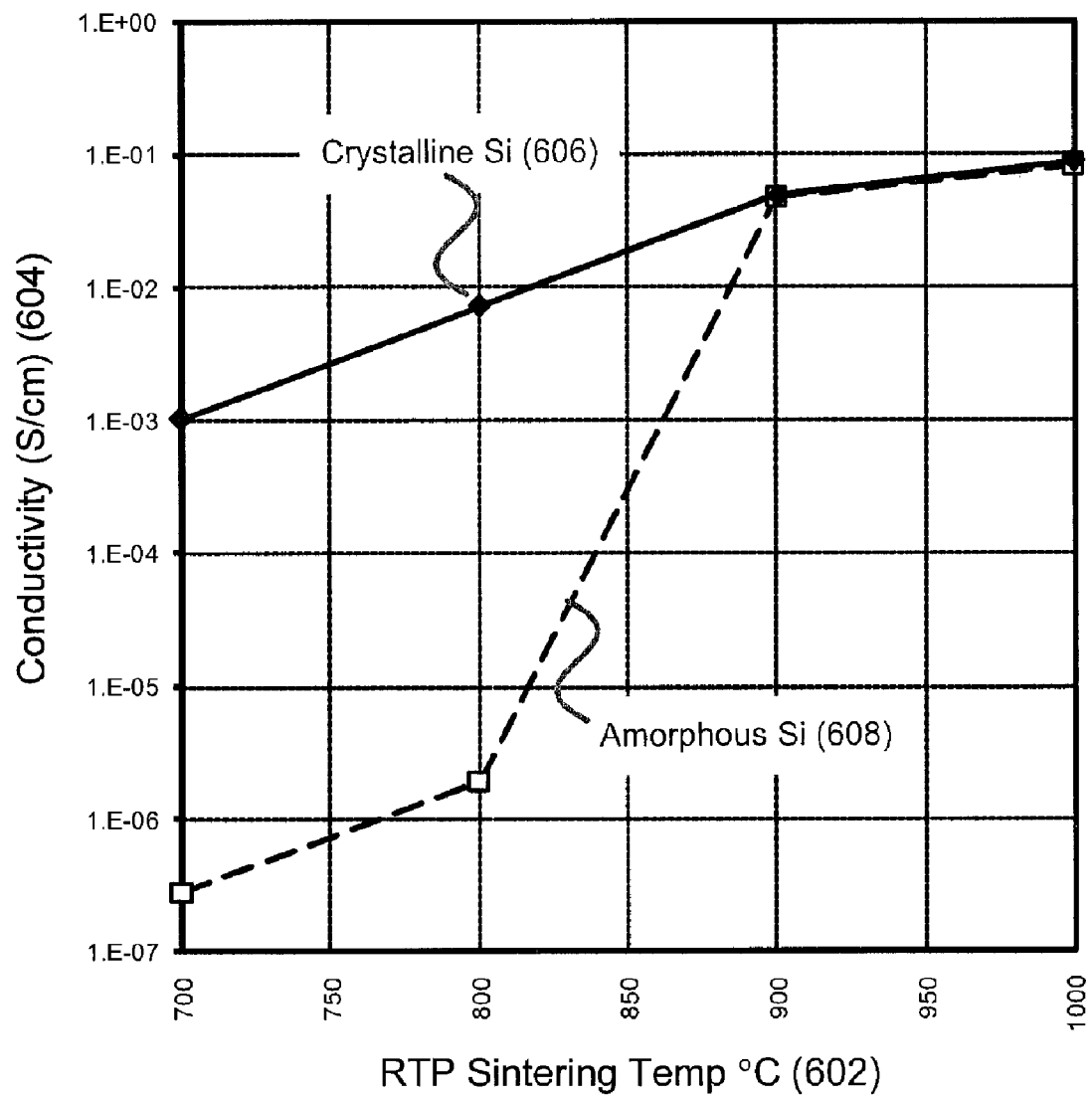
FIG. 6 shows a comparison of conductivity of an amorphous n-type nanoparticle film to a crystalline n-type nanoparticle film, in accordance with the present invention.

Referring now to FIG. 6, a comparison of the conductivity of an amorphous n-type nanoparticle film (608) to a crystalline n-type nanoparticle film (606) is shown, in accordance with the present invention. Horizontal axis 602 shows rapid thermal processing (RTP) apparatus sintering temperature (° C.), while vertical axis 604 shows conductivity (S/cm).

Initially, the amorphous n-type nanoparticles (608) and the crystalline n-type nanoparticles were first manufactured, and then dispersed in chloroform/chlorobenzene solution (4:1 v/v ratio) with a concentration of 20 mg of powder per one mL of solvent. Each solution was then agitated using an ultrasonic horn for 15 minutes using a power setting of 35%.

A set of eight films (four amorphous n-type nanoparticle films and four crystalline n-type nanoparticle films) was then created by depositing approximately 300-350 μL of each solution onto eight 1×1 inch square quartz substrates (each substrate corresponding to a particular conductivity reading for either amorphous or crystalline n-type nanoparticles) and spun at 1000 rpm for 60 seconds. Additional solvent drying was performed by placing all the substrates on a hotplate held at 100° C. for 30 minutes.

The substrates were then placed face down on a silicon carrier wafer and heated to temperatures (700° C., 800° C., 900° C., 1000° C.) for 30 seconds in a rapid thermal processor (RTP), in an Ar ambient environment at about 30° C./second. 1500 Å thick aluminum lines were then evaporated onto the substrates with variable spacing.

The conductivity of the film was then measured by applying a voltage between the aluminum lines and measuring the current carried by the Si film across the gap between the two aluminum lines.

For both of the amorphous n-type nanoparticle film (608) and the crystalline n-type nanoparticle film (609), conductivity increases as temperature increases, corresponding to the increasing necking (and hence density) of the nanoparticle layer. At about 900° C., both plots merge, corresponding to the dopant activation, and an increase in crystallinity of the amorphous n-type nanoparticles film (608). That is, from a physical perspective, both the amorphous n-type nanoparticle film (608) and the crystalline n-type nanoparticle film (606) are electrically substantially the same.

Figure 7:
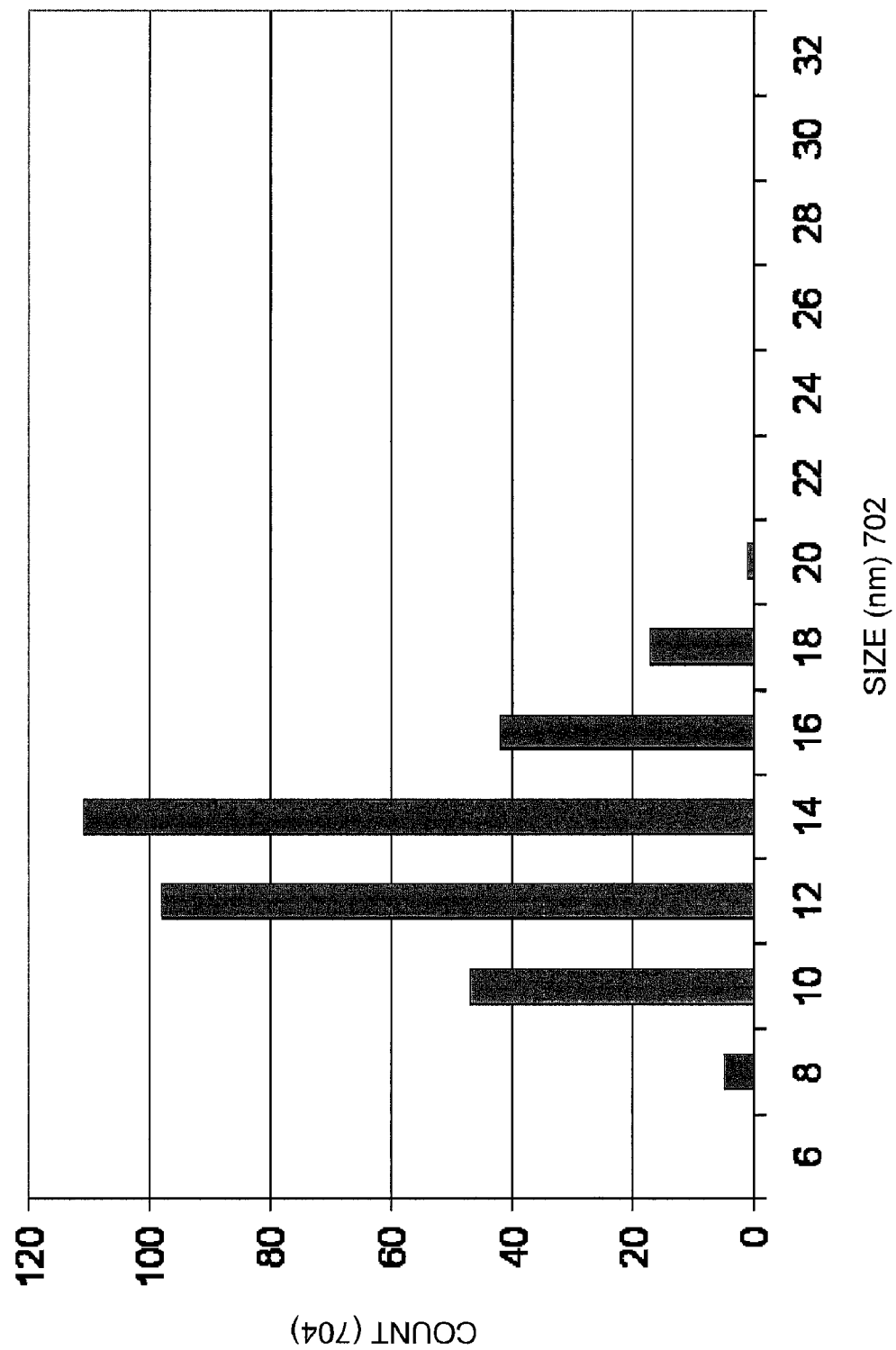
FIG. 7 shows a particle size distribution for crystalline n-type Si nanoparticles, in accordance with the present invention.

Referring now to FIG. 7, a particle size distribution for crystalline n-type Si nanoparticles is shown, in accordance with the present invention. Horizontal axis 702 shows Si nanoparticle size in nanometers (nm), while vertical axis 704 shows particle count.

In general, particle sizes are measured by comparing the diameter of individual particles from transmission electron microscopy (TEM) images. The average particle size and size distribution may then be calculated by using histograms and standard data processing algorithms. Consequently, a narrow distribution of nanoparticle sizes (here about 13 nm) may be obtained using a process as described in FIGS. 4A-C.

Figure 8:
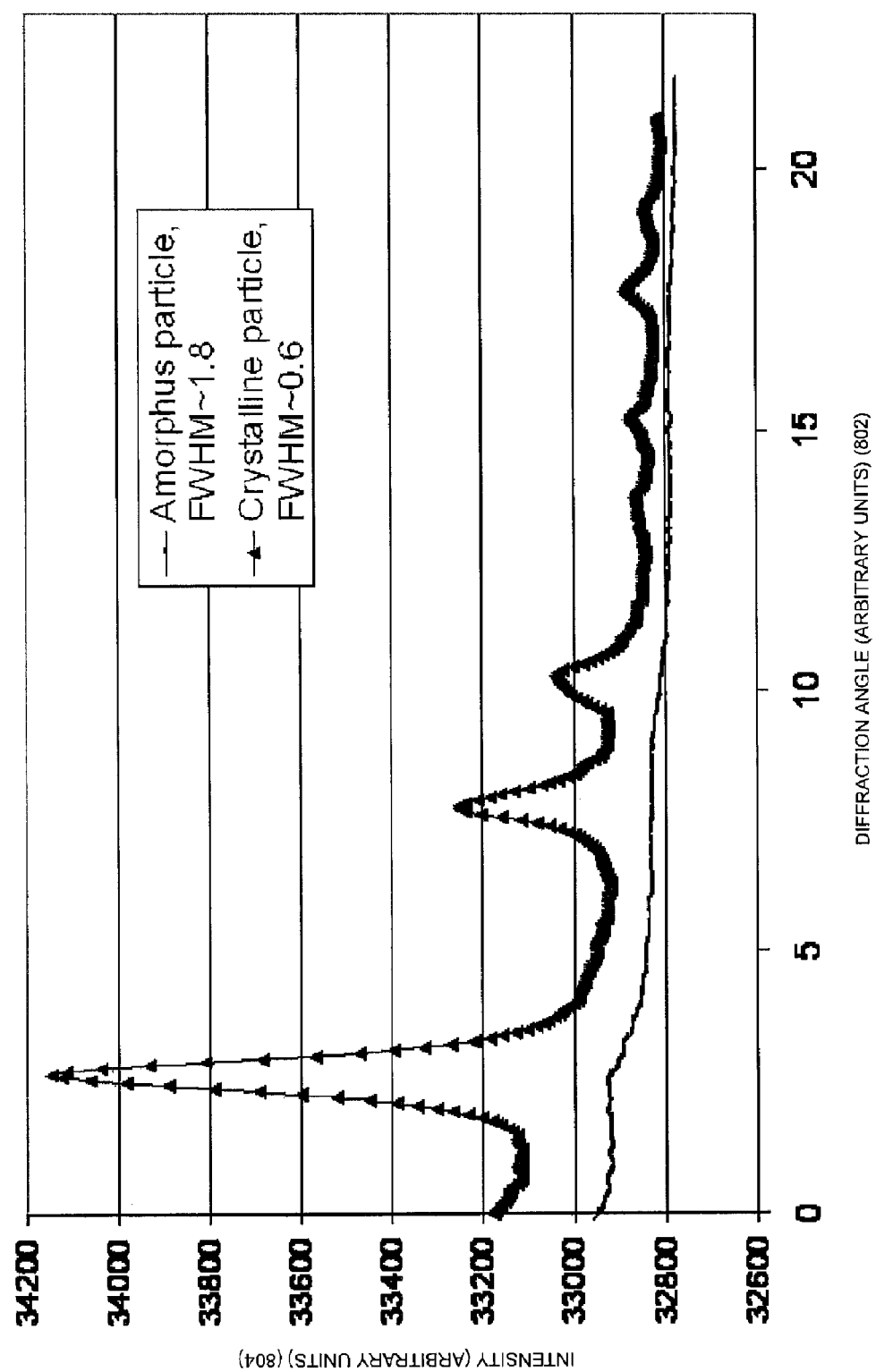
FIG. 8 shows a comparison of the degree of crystallinity of a crystalline n-type Si nanoparticle to an amorphous n-type Si nanoparticle, in accordance with the present invention.

Referring now to FIG. 8, a comparison is shown of the degree of crystallinity of a crystalline n-type Si nanoparticle to an amorphous n-type Si nanoparticle using selected area diffraction (SAD), in accordance with the present invention. Horizontal axis 802 shows diffraction angle in arbitrary units, while vertical axis 804 shows intensity in arbitrary units.

SAD is generally a crystallographic experimental technique that can be performed inside a transmission electron microscope (TEM). In a TEM, a thin crystalline specimen (here a Si nanoparticle) is subjected to a parallel beam of high-energy electrons. Because the wavelength of high-energy electrons is a fraction of a nanometer, and the spacings between atoms in a solid is only slightly larger, the atoms act as a diffraction grating to the electrons, a portion of which are diffracted to particular angles, determined by the crystal structure of the sample. Since degree of crystallinity is often determined in comparison to a non-crystalline structure, arbitrary units are often used. In general, as the SAD measurements are plotted, the sharper the peak, the greater the crystallinity. A common measure of the peak quality is FWHM (Full Width at Half Maximum), or the horizontal width of a peak at have its intensity height from a plot base.

Here, in comparison to an amorphous Si n-type nanoparticle with a FWHM of about 0.6, the crystalline Si n-type nanoparticle has a FWHM of about 1.8. That is, about 3× greater. Therefore, in an advantageous manner, by using the process as described in FIG. 4, a substantially crystalline Group IV nanoparticle may be produced.

Example 5

Figure 9:
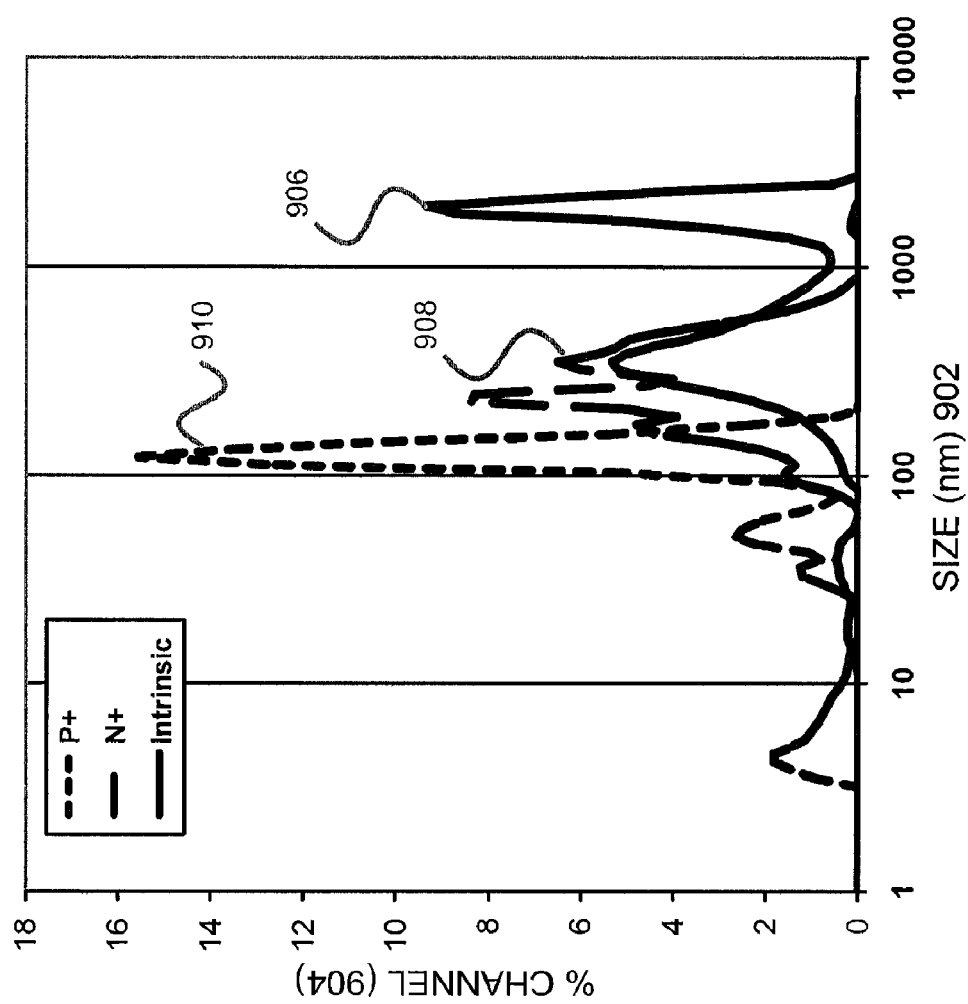
FIG. 9 shows the size distribution for three types of Si nanoparticle inks using dynamic light scattering, in accordance with the present invention.

Referring now to FIG. 9, the size distribution for three types of Si nanoparticle colloidal dispersions using dynamic light scattering is shown, in accordance with the present invention. Horizontal axis 902 shows particle agglomerate size in a logarithmic nanometer (nm) scale, while vertical axis 904 shows % channel (e.g., the percentage of particles in a size range in each count). In general, in colloidal dispersions of nanoparticles, the particles tend to form lose agglomerates in order to reduce their surface energy. Agglomerates typically comprise very weak bonds between the nanoparticles, and can be easily disassociated with the addition of small mechanical or thermal energy. Thus, in general, the larger the size of underlying nanoparticle, the larger the corresponding size of the agglomerate.

Generally, dynamic light scattering transmits a laser beam through a colloidal dispersion. Consequently, the suspended particles scatter some of the light in all directions. When the particles are generally very small compared with the wavelength of the light, the intensity of the scattered light is uniform in all directions. Thus, it is possible to observe time-dependent fluctuations in the scattered intensity using a suitable detector such as a photomultiplier capable of operating in photon counting mode.

Generally, these fluctuations arise from random thermal (Brownian) particle motion which caused the distance between particles to be varying. Constructive and destructive interference of light scattered by neighboring particles within the illuminated zone gives rise to the intensity fluctuation at the detector plane which, as it arises from particle motion, contains information about this motion.

Analysis of the time dependence of the intensity fluctuation can therefore yield the diffusion coefficient of the particles from which, knowing the viscosity of the medium, the hydrodynamic radius or diameter of the particles can be calculated.

Here, a first colloidal dispersion 906 is loaded with intrinsic Si nanoparticles. A second colloidal dispersion 908 is loaded with n-type Si nanoparticles. And a third colloidal dispersion 910 is loaded with p-type Si nanoparticles. The ratio of silicon nanoparticles to solvent for all three colloidal dispersions was 20 mg/ml.

The colloidal dispersions were prepared using pure IBA (iso-butanol) solvent. Particles and solvent were mixed and the mixture was stirred for 30 min by stirring at about 100° C. followed by about a 15 min ultrasonic horn sonication at about 15% power. The colloidal dispersions were further filtered through 5 micron Nylon filter.

Consequently, in comparison to first colloidal dispersion 906 with intrinsic Si nanoparticles (with an agglomerate size centering at about 1000 nm), the second colloidal dispersion 908 with n-type Si nanoparticles and the third colloidal dispersion 910 with p-type Si nanoparticles each have agglomerate size centering at much smaller colloidal dispersions. That is, the second colloidal dispersion 908 has agglomerate size centering at about 200 nm, while the third colloidal dispersion 910 has agglomerate size centering at about 100 nm.

Consequently, doped Group IV nanoparticles with small agglomerate sizes, and thus small individual particle diameters, can be made using the method as described in FIGS. 4A-C.

Example 6

Figure 10:
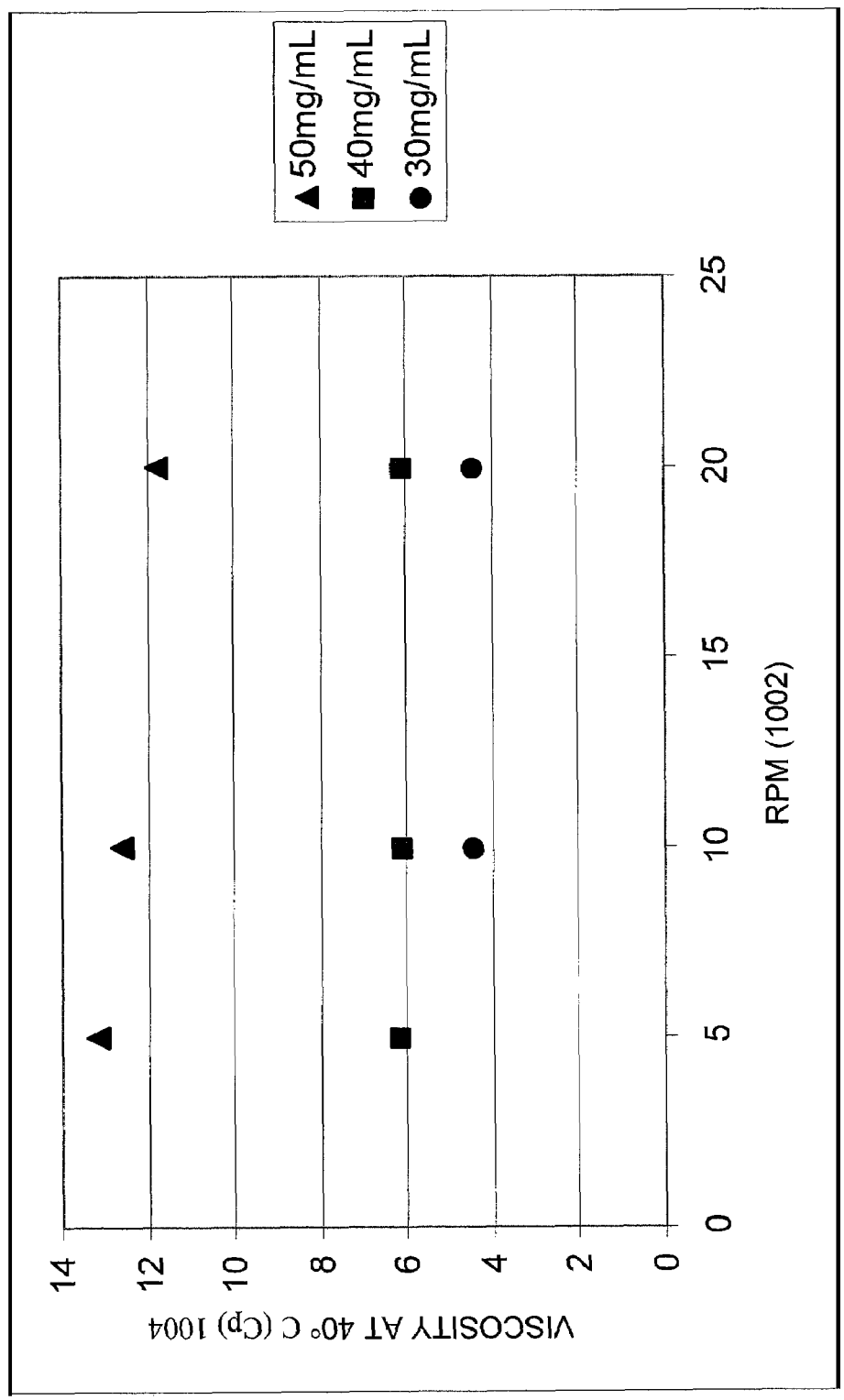
FIG. 10 shows a set of n-type Si nanoparticle colloidal dispersions of varying viscosity, in accordance with the present invention.

Referring now to FIG. 10, a set of n-type Si nanoparticle colloidal dispersions of varying viscosity is shown, in accordance with the present invention. Horizontal axis 1002 shows RPM (revolutions per minute corresponding to shearing force), while vertical axis 1004 shows measured viscosity at 40° C. in Cp (centipoise).

In general, most nanoparticle application techniques, such as inkjet printing, benefit from colloidal dispersions that behave as Newtonian fluids. A Newtonian fluid is generally a fluid that flows like water. That is, its viscosity is substantially the same at a given temperature and pressure regardless of the forces acting on it.

Here, a set of amorphous n-type Si nanoparticle colloidal dispersions were produced, in accordance with the present invention. A first colloidal dispersion was made at 30 mg of amorphous Si nanoparticles per ml of solvent. A second colloidal dispersion was made of amorphous Si nanoparticles at 40 mg of Si nanoparticles per ml of solvent. And a third colloidal dispersion was made of amorphous Si nanoparticles at 50 mg of nanoparticles per ml of solvent. For all of the colloidal dispersions, the solvent used was cyclohexanol/cyclohexanone mixtures (CHOH/CHO 1:1).

The colloidal dispersions were then prepared inside an $N^2$ glove box. About 1205 mg of the n-type type amorphous Si nanoparticles was first dispersed in 12 mL of the dispersant/primary solvent, and then distilled cyclohexanol (CHOH), by heating in 40 mL glass vial for 30 min at 82 C with magnetic stirring (IKA hotplate setting 100 C, stir setting 1000, ⅛" stir bar).

This suspension (100 mg Si/mL) was processed on a high shear mixer (15,000 RPM, 5 min, 10 mm probe). 7.9 mL of the 100 mg Si/mL suspension was then combined with 7.9 mL of the co-solvent, distilled cyclohexanone (CHO), to form the third colloidal dispersion of 50 mg/mL, CHOH/CHO 1:1. This third colloidal dispersion was processed on the high-shear mixed at 1000 RPM for 5 min. to complete the mixing, then filtered through 41 um Nylon mesh (25 mm diameter, Millipore), followed by filtration through 11 um Nylon and 5 um Nylon 25 mm syringe-type filters.

This pre-filtered 50 mg/mL colloidal dispersion was then used to prepare lower loadings (40 mg/mL and 30 mg/mL) by dilution with equal volumes of CHOH and CHO. All three colloidal dispersions were filtered to 0.45 um Nylon (syringe-type filter) and measured for viscosity. Viscosities were measured at 40° C. on a Brookfield LV DV-I+ viscometer using the CPE40 disk. Viscosity is generally calculated from the torque exerted on a rotating disk by a film of the colloidal dispersion between the disk and stationary cup.

For each colloidal dispersion, 0.5 mL was first loaded into a cup installed on the viscometer, and allowed to equilibrate for 15 minutes prior to taking readings. Viscosities were recorded with the disk rotating at 4, 10, and 20 RPM, in order of RPM (lowest RPM first, highest RPM last).

As can be seen, all of the colloidal dispersions maintained substantially the same viscosity as the shear force was increased from about 4 to about 20 RPM. Consequently, Group IV nanoparticles manufactured using the method as described in FIGS. 4A-C show may show Newtonian behavior when mixed in a colloidal dispersion, and thus may be used for ink jet printing.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention. Advantages of the invention include the production of low cost and efficient junctions for electrical devices, such as solar cells. Additional advantages include the production stable colloidal dispersions which can be deposited on a substrate, as well as the ability to print a pattern in a single step.

Having disclosed exemplary embodiments and the best mode, modifications and variations may be made to the disclosed embodiments while remaining within the subject and spirit of the invention as defined by the following claims.

What is claimed is:

1. A method for preparing a nanoparticle thin film comprising the steps of:
flowing a Group IV precursor gas through a plasma reactor with an annular channel;
igniting the Group IV precursor gas with an RF signal to form a set of Group IV nanoparticles;
dispersing the set of Group IV nanoparticles in a solvent to form an ink;
depositing the ink on a substrate; and
sintering the set of nanoparticles;
wherein the nanoparticle thin film is formed.

2. The method of claim 1, wherein each nanoparticle of the set of Group IV nanoparticles has a sphericity of between about 1.0 and about 2.0, and a diameter of between about 4 nm and about 100 nm.

3. The method of claim 1, wherein the step of flowing a Group IV precursor gas through an annular channel further comprises flowing a dopant gas through the annular channel.

4. The method of claim 1, wherein the step of sintering the set of nanoparticles comprises using one of a resistive heater and a radiative heater.

5. The method of claim 1, wherein the substrate is one of a silicon substrate and a polyimide substrate.

6. The method of claim 1, wherein the step of dispersing the set of Group IV nanoparticles in a solvent to form an ink comprises dispersing the set of Group IV nanoparticles in a substantially oxygen-free environment.

7. The method of claim 1, wherein the solvent comprises at least one of an organic compound and an organosiloxane compound.

8. The method of claim 7 wherein the organic compound is at least one of an alcohol; an aldehyde, a ketone, a carboxylic acid, an ester, an amine, and a halogenated hydrocarbon.

9. The method of claim 3, wherein the dopant gas comprises at least one of silane, disilane, germane, digermane, a halide analog, phosphine, arsine, boron diflouride, trimethyl borane, and diborane.

10. A nanoparticle thin film prepared by the method of claim 1.

11. A method for preparing a nanoparticle thin film comprising the steps of:
flowing a Group IV precursor gas through a plasma reactor with an annular channel, the annular channel defined by an outer tube and an inner tube;

igniting the Group IV precursor gas with an RF signal coupled between an outer electrode tube and an inner electrode tube to form a set of Group IV nanoparticles;

dispersing the set of Group IV nanoparticles in a solvent to form an ink;

depositing the ink on a substrate in a pattern; and sintering the set of nanoparticles;

wherein the nanoparticle thin film is formed.

12. The method of claim 11, wherein each nanoparticle of the set of Group IV nanoparticles has a sphericity of between about 1.0 and about 2.0 and a diameter of between about 4 nm and about 100 nm.

13. The method of claim 11, wherein the step of flowing a Group IV precursor gas through an annular channel further comprises flowing a dopant gas through the annular channel.

14. The method of claim 11, wherein the step of sintering the set of nanoparticles comprises using one of a resistive heater and a radiative heater.

15. The method of claim 11, wherein the substrate is one of a silicon substrate and a polyimide substrate.

16. The method of claim 11, wherein the step of dispersing the set of Group IV nanoparticles in a solvent to form an ink comprises dispersing the set of Group IV nanoparticles in a substantially oxygen-free environment.

17. The method of claim 11, wherein the solvent comprises at least one of an organic compound and an organosiloxane compound.

18. The method of claim 17 wherein the organic compound is at least one of an alcohol, an aldehyde, a ketone, a carboxylic acid, an ester, an amine, and a halogenated hydrocarbon.

19. The method of claim 11, wherein the step of depositing the ink on a substrate comprises depositing the ink with an inkjet printer.

* * * * *